United States Patent
Cheng

(10) Patent No.: US 8,669,614 B2
(45) Date of Patent: Mar. 11, 2014

(54) MONOLITHIC METAL OXIDE SEMICONDUCTOR FIELD EFFECT TRANSISTOR-SCHOTTKY DIODE DEVICE

(75) Inventor: Chien-Hsing Cheng, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 133 days.

(21) Appl. No.: 13/349,572

(22) Filed: Jan. 13, 2012

(65) Prior Publication Data
US 2012/0292695 A1 Nov. 22, 2012

(30) Foreign Application Priority Data
May 20, 2011 (TW) .............................. 100117791 A

(51) Int. Cl.
*H01L 29/66* (2006.01)

(52) U.S. Cl.
USPC .......................................... 257/334; 257/476

(58) Field of Classification Search
USPC ................... 257/334, 379, 476, 488, 490, 495
See application file for complete search history.

(56) References Cited

U.S. PATENT DOCUMENTS

| | | | |
|---|---|---|---|
| 6,351,018 B1 | 2/2002 | Sapp | |
| 6,433,396 B1 | 8/2002 | Kinzer | |
| 8,222,678 B2 * | 7/2012 | Liu | ................................ 257/213 |
| 2009/0315107 A1 | 12/2009 | Hsieh | |
| 2010/0176446 A1 | 7/2010 | Hsieh | |

* cited by examiner

Primary Examiner — Mark Prenty
(74) Attorney, Agent, or Firm — Winston Hsu; Scott Margo

(57) ABSTRACT

A monolithic metal oxide semiconductor field effect transistor (MOSFET)-Schottky diode device including a chip, a MOSFET, a Schottky diode and a termination structure is provided. The chip is divided into a transistor region, a diode region and a termination region. The MOSFET is disposed on the transistor region. The Schottky diode is disposed on the diode region. The termination structure is disposed on the termination region. The transistor region and the diode region are divided by the termination region. The MOSFET and Schottky diode share the termination structure.

9 Claims, 6 Drawing Sheets

MONOLITHIC METAL OXIDE SEMICONDUCTOR FIELD EFFECT TRANSISTOR-SCHOTTKY DIODE DEVICE

CROSS-REFERENCE TO RELATED APPLICATION

This application claims the priority benefit of Taiwan application serial no. 100117791, filed on May 20, 2011. The entirety of the above-mentioned patent application is hereby incorporated by reference herein and made a part of this specification.

BACKGROUND OF THE INVENTION

1. Field of the Invention

The present invention relates to a semiconductor device, in particular, to a monolithic metal oxide semiconductor field effect transistor (MOSFET)-Schottky diode device.

2. Description of Related Art

In a conventional high-efficiency direct current/direct current converter application technology, a Schottky diode is integrated into a semiconductor power device such as a MOSFET, so that the Schottky diode is configured in parallel with the MOSFET. In this manner, on resistance and gate capacity may be reduced, thereby further reducing power consumption and increasing a switching speed of a switch of the semiconductor power device.

With a miniaturization development trend of electronic devices, an integrated monolithic device is required to reduce space occupation.

Two manners for integrating the Schottky diodes and the MOSFETs exist in the prior art.

In one manner, the Schottky diodes and the MOSFETs are integrated inside a unit cell, that is, the Schottky diodes are interspersed among the MOSFETs, and termination structures surround the Schottky diodes and the MOSFETs.

The other manner is a manner of a multi-chip module, in which the Schottky diodes and the MOSFETs are respectively made on different chips, and then the Schottky diodes and the MOSFETs are encapsulated together. As the Schottky diodes and the MOSFETs are respectively made on different chips, and termination structures are respectively disposed around the Schottky diodes and the MOSFETs, bonding wires need to be additionally disposed to electrically connect the Schottky diodes and the MOSFETs, which causes the rising of a parasitic inductance value, thereby affecting device efficiency.

SUMMARY OF THE INVENTION

Accordingly, the present invention is directed to a monolithic MOSFET-Schottky diode device, which is capable of shrinking a device size and improving device efficiency.

The present invention provides a monolithic MOSFET-Schottky diode device, which includes a chip, a MOSFET, a Schottky diode and a termination structure. The chip is divided into a transistor region, a diode region and a termination region. The MOSFET is disposed on the transistor region. The Schottky diode is disposed on the diode region. The termination structure is disposed on the termination region. The transistor region and the diode region are divided by the termination region. The MOSFET and the Schottky diode share the termination structure.

In an embodiment of the present invention, the termination structure surrounds the MOFSET and the Schottky diode.

In an embodiment of the present invention, the MOSFET may be a flat MOSFET or a trench MOSFET.

In an embodiment of the present invention, the MOSFET may be a super junction MOSFET, a dual gate MOSFET or a floating gate MOSFET.

In an embodiment of the present invention, the Schottky diode may be a junction barrier Schottky diode or a trench Schottky diode.

In an embodiment of the present invention, the termination structure may be a guard ring structure, a floating limitation rings structure, a field plate structure, or a structure of field plate with floating limitation rings.

Based on the above description, the MOSFET and the Schottky diode are integrated on a single chip in the present invention; in addition, the MOSFET and the Schottky diode share the termination structure, therefore shrinking the device size, reducing a parasitic inductance value caused by bonding wires, reducing current surges and decreasing electromagnetic interference.

In order to make the aforementioned features and advantages of the present invention more comprehensible, the present invention is described in detail below with reference to the embodiments and accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
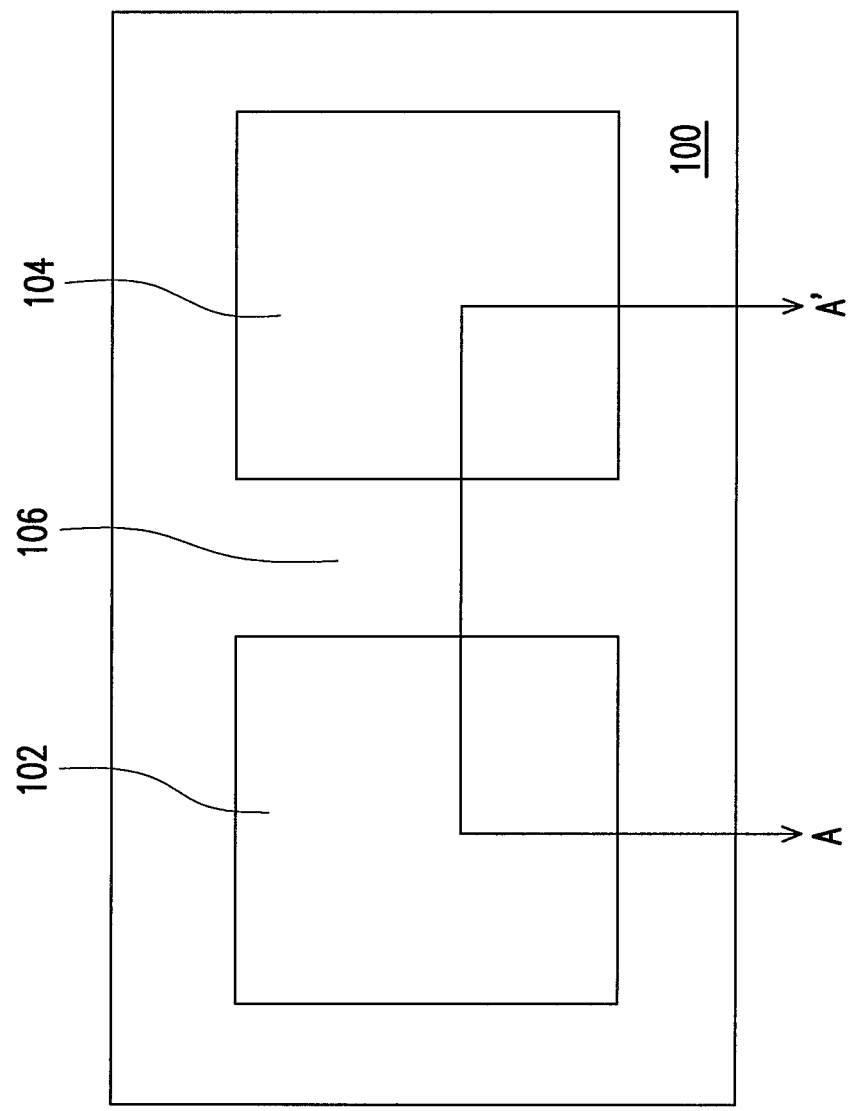
FIG. 1 is a top view of a monolithic MOSFET-Schottky diode device according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

In a monolithic MOSFET-Schottky diode device according to the present invention, a MOSFET and a Schottky diode are integrated in a single chip; in addition, the MOSFET and the Schottky diode share a termination structure.

Types of the MOSFET are not limited in the present invention, which may be divided into a flat MOSFET and a trench MOSFET from the perspective of a gate disposing manner; and may be divided into a super junction MOSFET, a dual gate MOSFET and a floating gate MOSFET from the perspective of a design layout manner.

Types of the Schottky diode are not limited in the present invention, and the Schottky diode may be a junction barrier Schottky diode or a trench Schottky diode.

Types of the termination structure are not limited in the present invention, and the termination structure may be a guard ring structure, a floating limitation rings structure, a field plate structure or a structure of field plate with floating limitation rings.

Figure 2:
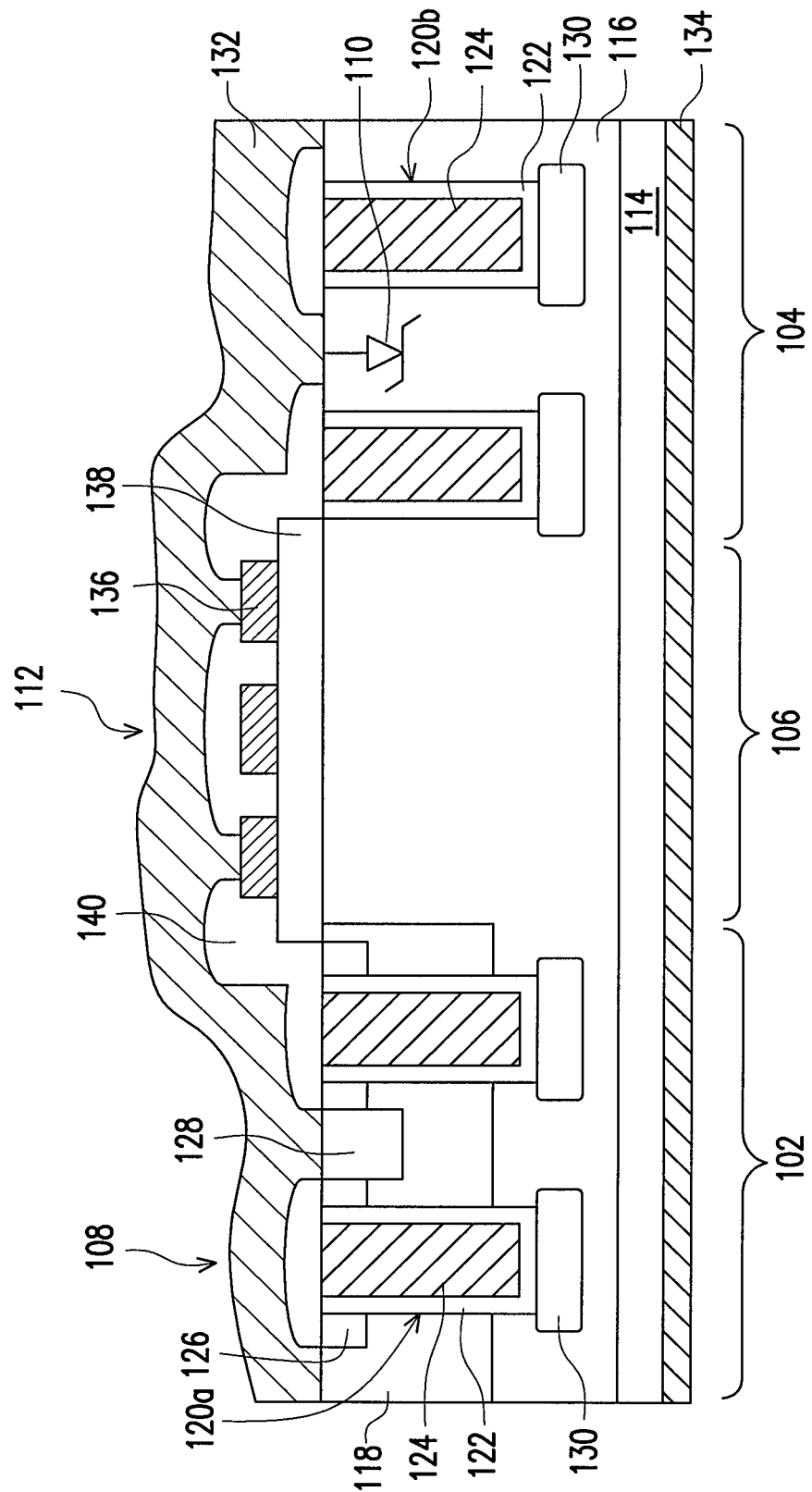
FIG. 2 is a sectional view of FIG. 1 along a line A-A'.

FIG. 1 is a top view of a monolithic MOSFET-Schottky diode device according to an embodiment of the present invention. FIG. 2 is a sectional view of FIG. 1 along a line A-A'.

Referring to FIG. 1, a monolithic MOSFET-Schottky diode device includes a chip 100. The chip 100 is divided into a transistor region 102, a diode region 104 and a termination region 106. The transistor region 102 and the diode region 104 are divided by the termination region 106, and the termination region 106 surrounds the transistor region 102 and the diode region 104.

In this embodiment, a MOSFET 108 is an N-type trench MOSFET, a Schottky diode 110 is a trench Schottky diode, and a termination structure 112 is a field plate structure.

Referring to FIG. 2, the MOSFETs 108 are disposed on the transistor region 102. The Schottky diodes 110 are disposed on the diode region 104. The termination structures 112 are disposed on the termination region 106.

In the transistor region 102, the MOSFETs 108 are disposed on an N$^+$-type substrate 114. An N$^-$-type doped region 116 is disposed on the N$^+$-type substrate 114. A P$^-$-type doped region 118 is disposed on the N$^-$-type doped region 116. The MOFSET 108 includes a dielectric layer 122 disposed inside a groove 120a, a conductive layer 124 served as a gate, and an N$^+$-type source 126. A material of the dielectric layer 122 may be, for example, silicon oxide. A material of the conductive layer 124 may be, for example, doped polycrystalline silicon. A P$^+$-type doped region 128 is disposed between the N$^+$-type sources 126 of two adjacent MOSFETs 108. A conductive layer 132 contacts the P$^+$-type doped region 128. A material of the conductive layer 132 includes metal such as aluminum and copper. A P$^+$-type doped region 130 may also be selectively disposed on a bottom portion of the groove 120a. Another surface of the N$^+$-type substrate 114 opposite to the MOSFET 108 is disposed with a conductive layer 134. The conductive layer 134 is used as a drain of the MOSFET 108.

In the diode region 104, the same dielectric layer 122 and the conductive layer 124 filling groove 120b is also disposed in the groove 120b. The conductive layer 132 is disposed on the N$^+$-type substrate 114. The conductive layer 132 contacts the N$^-$-type doped region 116 among the grooves 120b, and is served as an anode of the Schottky diode 110. The conductive layer 134 is disposed on another surface of the N$^+$-type substrate 114 opposite to the Schottky diode 110 and is served as a cathode of the Schottky diode 110. A bottom portion of the groove 120b may also be selectively disposed with a P$^+$-type doped region 130. In addition, interlayer insulation layers 140 covering the conductive layers 124 or conductive layers 136 may be disposed on the N$^+$-type substrate 114.

In the termination region 106, a field oxide layer 138 is formed on the N$^+$-type substrate 114. A material of the field oxide layer 138 may be, for example, silicon oxide. A plurality of conductive layers 136 are formed on the field oxide layer 138. A material of the conductive layer 136 may be, for example, doped polycrystalline silicon. These conductive layers 136 connect the MOSFETs 108 and the Schottky diodes 110 through the conductive layer 132. That is, the MOSFET 108 and the Schottky diode 110 share the termination structure 112. In addition, the termination structure 112 surrounds the MOSFET 108 and the Schottky diode 110.

Figure 3:
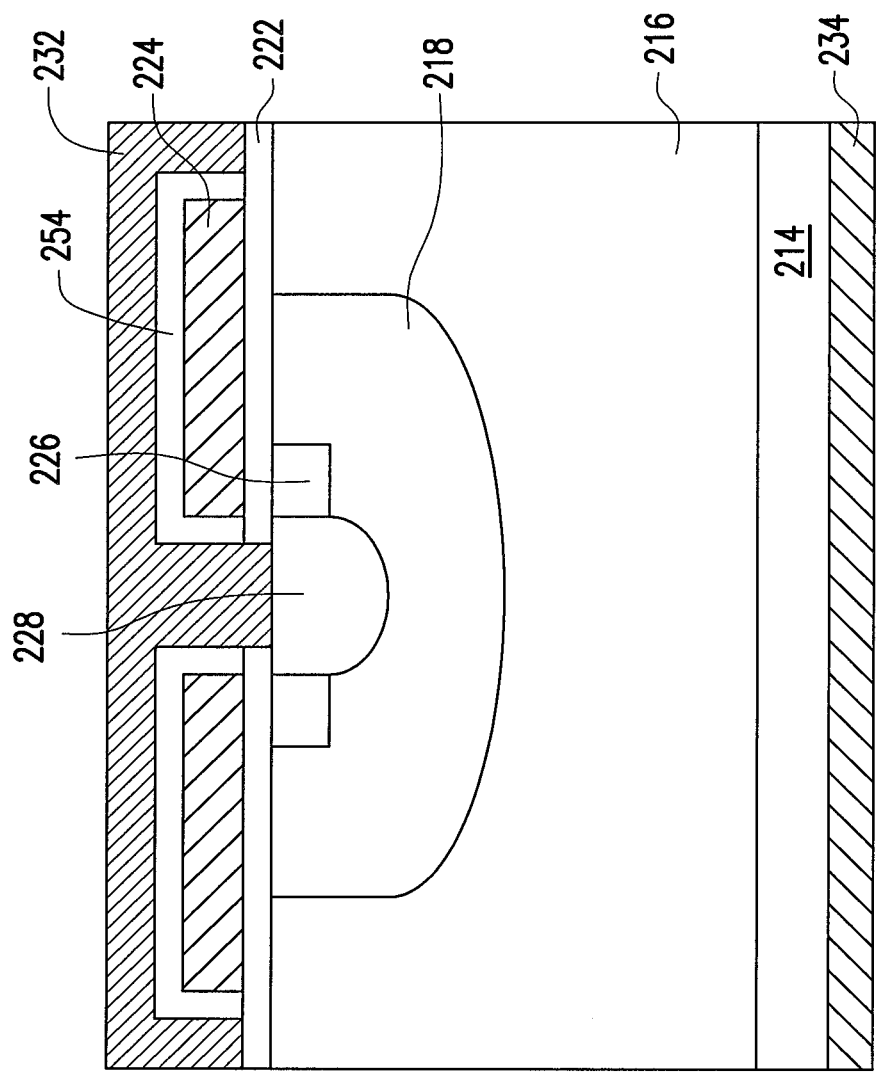
FIG. 3 is a sectional view of a flat MOSFET.

FIG. 3 is a sectional view of a flat MOSFET. The MOSFET in the monolithic MOSFET-Schottky diode device of the present invention may also be the flat MOSFET.

As shown in FIG. 3, a plurality of MOSFETs 208 are disposed on an N$^+$-type substrate 214. The N$^+$-type substrate 214 is disposed with an N$^-$-type doped region 216. A P$^-$-type doped region 218 is disposed in the N$^-$-type doped region 216. The MOSFET 208 includes a dielectric layer 222 disposed on the N$^+$-type substrate 214, a conductive layer 224 served as a gate, and an N$^+$-type source 226. A material of the dielectric layer 222 may be, for example, silicon oxide. A material of the conductive layer 224 may be, for example, doped polycrystalline silicon. A P$^+$-type doped region 228 is disposed between the N$^+$-type sources 226 of two adjacent MOSFETs 208. A conductive layer 232 contacts the P$^+$-type doped region 228. A material of the conductive layer 232 includes metal such as aluminum and copper. Another surface of the N$^+$-type substrate 214 opposite to the MOSFETs 208 is disposed with a conductive layer 234. The conductive layer 234 is served as a drain of the MOSFET 208. A material of the conductive layer 234 includes metal such as aluminum and copper. In addition, interlayer insulation layers 254 covering the conductive layers 224 are disposed on the N$^+$-type substrate 114.

Figure 4:
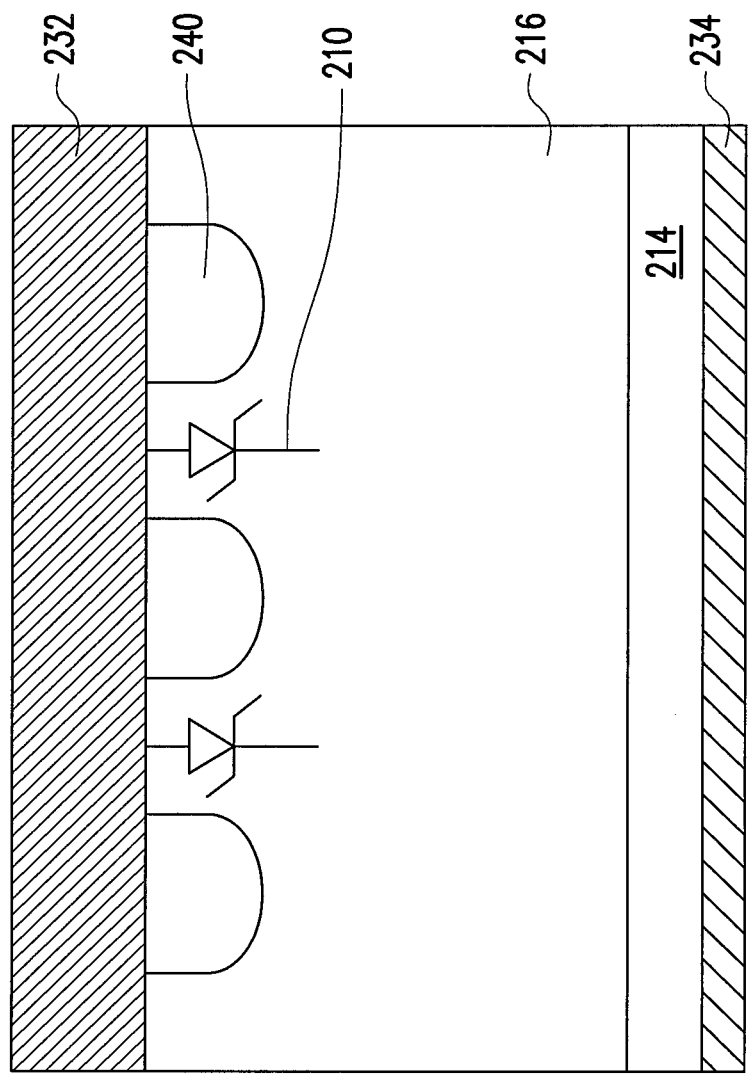
FIG. 4 is a sectional view of a junction barrier Schottky diode.

FIG. 4 is a sectional view of a junction barrier Schottky diode. The Schottky diode in the monolithic MOSFET-Schottky diode device of the present invention may also be the junction barrier Schottky diode.

As shown in FIG. 4, P$^+$-type doped regions 240 are disposed in an N$^+$-type substrate 214. A conductive layer 232 is disposed on the N$^+$-type substrate 214. The conductive layer 232 contacts an N$^-$-type doped region 216 among the P$^+$-type doped regions 240, and is served as an anode of the Schottky diode 210. Another surface of the N$^+$-type substrate 214 opposite to the Schottky diodes 210 is disposed with a conductive layer 234. The conductive layer 234 is used to serve as a cathode of the Schottky diode 210.

Figure 5:
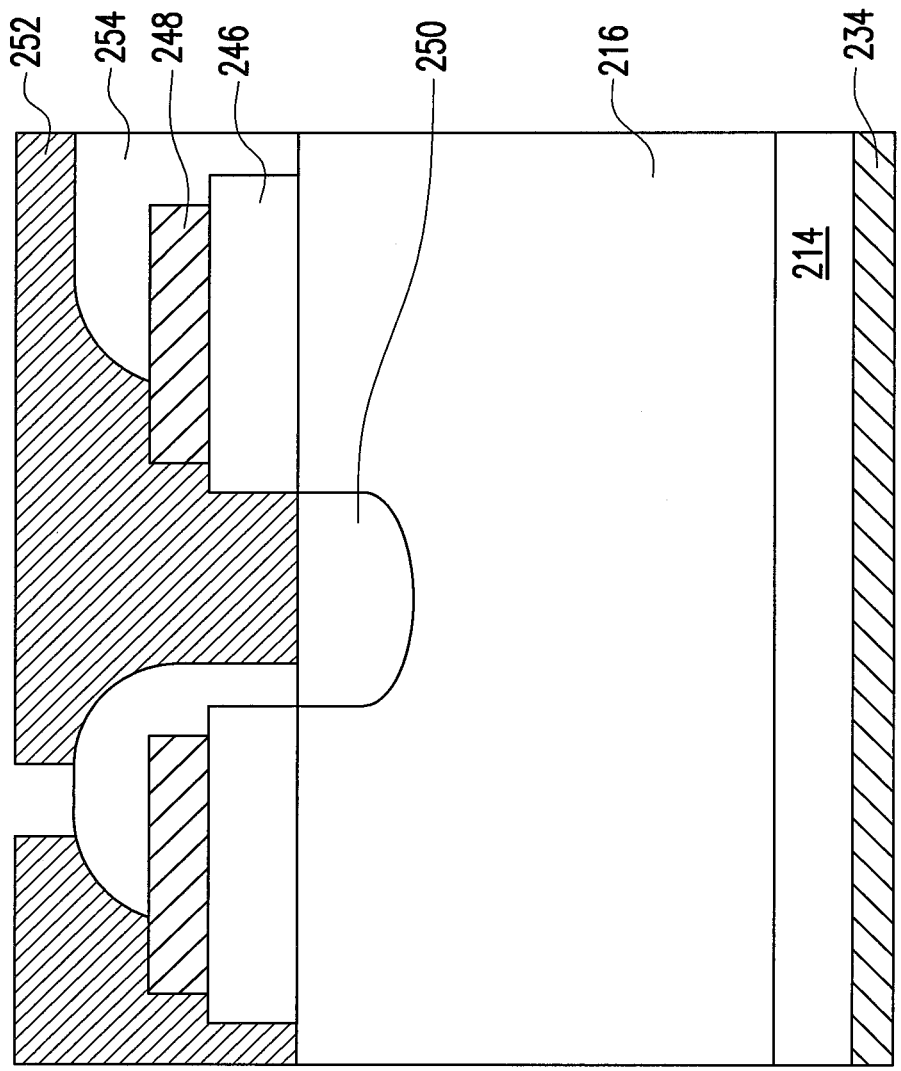
FIG. 5 is a sectional view of another field plate structure.

FIG. 5 is a sectional view of another field plate structure. A termination structure of a monolithic MOSFET-Schottky diode device in the present invention may also be a field plate structure as shown in FIG. 5.

A plurality of field oxide layers 246 are formed on an N$^+$-type substrate 214. A material of the field oxide layer 246 is, for example, silicon oxide. A plurality of conductive layers 248 are respectively formed on the field oxide layer 246. A material of the conductive layer 248 may be, for example, doped polycrystalline silicon. A P$^+$-type doped region 250 is formed in an N$^-$-type doped region 216 among the field oxide layers 246. The P$^+$-type doped region 250 and the conductive layers 248 connect the MOSFET and the Schottky diode through the conductive layer 252. In addition, interlayer insulation layers 254 covering a part of the field oxide layers 246 and the conductive layers 248 are disposed on the N$^+$-type substrate 214.

Figure 6:
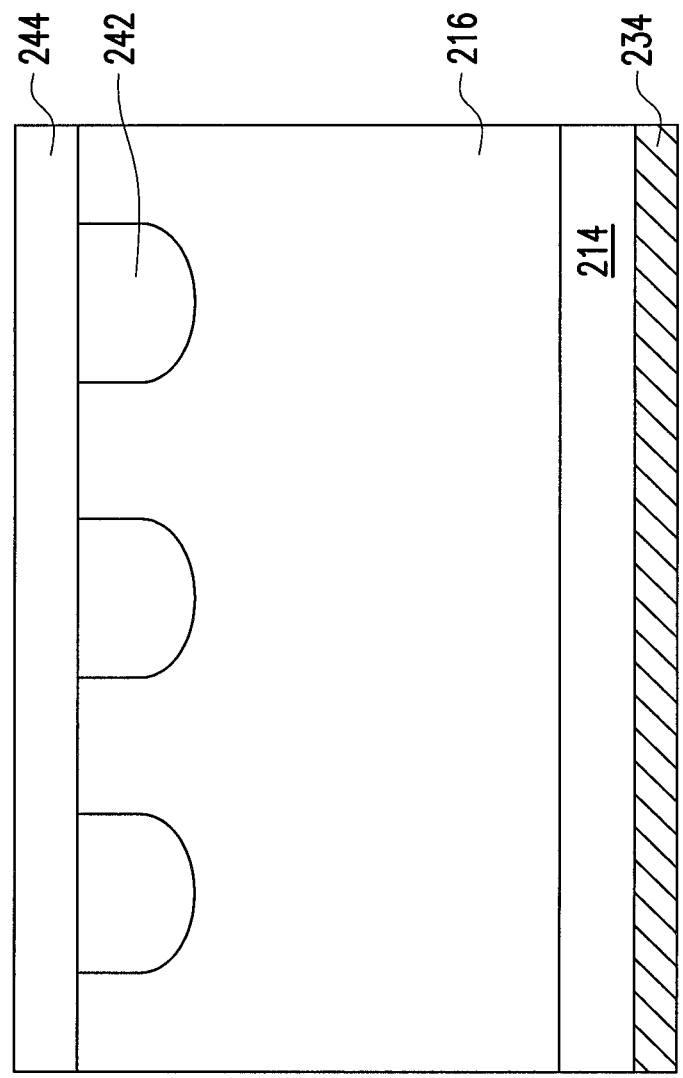
FIG. 6 is a sectional view of a guard ring structure.

FIG. 6 is a sectional view of a guard ring structure. A termination structure of a monolithic MOSFET-Schottky diode device in the present invention may also be a guard ring structure.

As shown in FIG. 6, P$^+$-type doped regions (guard rings) 242 are disposed in an N$^+$-type substrate 214. The P$^+$-type doped regions 242 may surround the MOSFETs and the Schottky diodes for example. An insulation layer 244 is disposed on the N$^+$-type substrate 214. A material of the insulation layer 244 may be, for example, silicon oxide.

In conclusion, in the monolithic MOSFET-Schottky diode of the present invention, the MOSFETs and the Schottky diodes only need to be integrated in a single chip; in addition, the MOSFETs and the Schottky diodes share the termination structures. Therefore, the MOSFETs, the Schottky diodes and the termination structures do not need to be limited. Instead, any combination of the MOSFETs, the Schottky diodes and the termination structures is allowed.

Moreover, the MOSFETs and the Schottky diodes are integrated in a single chip in the present invention; in addition, the MOSFETs and the Schottky diodes share the termination structures, therefore shrinking a device size, reducing a parasitic inductance value caused by bonding wires, reducing current surges and decreasing electromagnetic interference.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A monolithic metal oxide semiconductor field effect transistor (MOSFET)-Schottky diode device, comprising:
   a chip, divided into a transistor region, a diode region and a termination region;
   a MOSFET, disposed on the transistor region;
   a Schottky diode, disposed on the diode region; and
   a termination structure, disposed on the termination region and surrounding the MOSFET and the Schottky diode, wherein the transistor region and the diode region are divided by the termination region, and the MOSFET and Schottky diode share the termination structure.

2. The monolithic MOSFET-Schottky diode device according to claim 1, wherein the MOSFET is selected from a group consisting of a flat MOSFET and a trench MOSFET.

3. The monolithic MOSFET-Schottky diode device according to claim 1, wherein the MOSFET is selected from a group consisting of a super junction MOSFET, a dual gate MOSFET and a floating gate MOSFET.

4. The monolithic MOSFET-Schottky diode device according to claim 1, wherein the Schottky diode is selected from a group consisting of a junction barrier Schottky diode and a trench Schottky diode.

5. The monolithic MOSFET-Schottky diode device according to claim 2, wherein the Schottky diode is selected from a group consisting of a junction barrier Schottky diode and a trench Schottky diode.

6. The monolithic MOSFET-Schottky diode device according to claim 3, wherein the Schottky diode is selected from a group consisting of a junction barrier Schottky diode and a trench Schottky diode.

7. The monolithic MOSFET-Schottky diode device according to claim 1, wherein the termination structure is selected from a group consisting of a guard ring structure, a floating limitation rings structure, a field plate structure and a structure of field plate with floating limitation rings.

8. The monolithic MOSFET-Schottky diode device according to claim 5, wherein the termination structure is selected from a group consisting of a guard ring structure, a floating limitation rings structure, a field plate structure and a structure of field plate with floating limitation rings.

9. The monolithic MOSFET-Schottky diode device according to claim 6, wherein the termination structure is selected from a group consisting of a guard ring structure, a floating limitation rings structure, a field plate structure and a structure of field plate with floating limitation rings.

* * * * *